US012777875B2

(12) United States Patent
Tanoue et al.

(10) Patent No.: US 12,777,875 B2
(45) Date of Patent: Oct. 27, 2026

(54) SUBSTRATE PROCESSING APPARATUS, SUBSTRATE PROCESSING METHOD, AND SUBSTRATE MANUFACTURING METHOD

(71) Applicant: Tokyo Electron Limited, Tokyo (JP)

(72) Inventors: Hayato Tanoue, Kikuchi-gun (JP); Kento Araki, Kikuchi-gun (JP); Yohei Yamashita, Kikuchi-gun (JP); Gousuke Shiraishi, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 455 days.

(21) Appl. No.: 18/261,507

(22) PCT Filed: Jan. 4, 2022

(86) PCT No.: PCT/JP2022/000014
§ 371 (c)(1),
(2) Date: Jul. 14, 2023

(87) PCT Pub. No.: WO2022/153886
PCT Pub. Date: Jul. 21, 2022

(65) Prior Publication Data

US 2024/0312804 A1 Sep. 19, 2024

(30) Foreign Application Priority Data

Jan. 15, 2021 (JP) ................................ 2021-005325

(51) Int. Cl.
*H10P 72/00* (2026.01)
*H10P 34/42* (2026.01)
(Continued)

(52) U.S. Cl.
CPC .......... *H10P 72/0428* (2026.01); *H10P 34/42* (2026.01); *H10P 90/1916* (2026.01); *H10W 10/181* (2026.01)

(58) Field of Classification Search
CPC ........... H01L 21/268; H01L 21/67092; B23K 26/0622; B23K 26/0876; H10P 90/1916; H10P 10/12; H10P 34/42; H10P 72/0428
See application file for complete search history.

(56) References Cited

U.S. PATENT DOCUMENTS

2005/0233547 A1* 10/2005 Noda ................. H01L 21/6835 438/459
2009/0117707 A1* 5/2009 Shimomura ...... H01L 21/76254 257/E21.568
(Continued)

FOREIGN PATENT DOCUMENTS

JP 2007-220749 A 8/2007
JP 2012-015150 A 1/2012
(Continued)

OTHER PUBLICATIONS

Translation of Written Opinion in PCT/JP2022/000014.*
International Search Report of PCT/JP2022/000014 dated Mar. 15, 2022.

*Primary Examiner* — Mary A Wilczewski
(74) *Attorney, Agent, or Firm* — Shih IP Law Group, PLLC.

(57) ABSTRACT

A substrate processing apparatus configured to process a combined substrate in which a first substrate and a second substrate are bonded to each other includes a substrate holder configured to hold the combined substrate; a laser radiating unit configured to radiate laser light in a pulse shape to a laser absorbing layer formed between the first substrate and the second substrate; a moving mechanism configured to move the substrate holder and the laser radiating unit relative to each other; and a controller configured to control the laser radiating unit and the moving mecha-
(Continued)

nism. The controller sets an interval of the laser light radiated to the laser absorbing layer based on a thickness of the laser absorbing layer.

12 Claims, 9 Drawing Sheets

(51) Int. Cl.
*H10P 90/00* (2026.01)
*H10W 10/10* (2026.01)

(56) References Cited

U.S. PATENT DOCUMENTS

| | | | | |
|---|---|---|---|---|
| 2009/0239354 | A1* | 9/2009 | Suzawa | H01L 21/76254 257/E21.568 |
| 2010/0041211 | A1* | 2/2010 | Noda | H01L 21/6835 438/464 |
| 2011/0073847 | A1* | 3/2011 | Kobayashi | H10K 71/50 257/40 |
| 2011/0300356 | A1* | 12/2011 | Takamatsu | B32B 17/10761 428/212 |
| 2012/0118511 | A1* | 5/2012 | Imai | B32B 38/10 428/447 |
| 2014/0144593 | A1* | 5/2014 | Dang | H01L 21/67092 428/688 |
| 2015/0035173 | A1* | 2/2015 | Dang | G01R 31/2607 524/375 |
| 2017/0125268 | A1 | 5/2017 | Dang | |
| 2021/0245297 | A1* | 8/2021 | Ohtani | B23K 26/0648 |
| 2024/0071765 | A1* | 2/2024 | Tanoue | B23K 26/53 |
| 2024/0082957 | A1* | 3/2024 | Tanoue | B23K 26/0823 |
| 2024/0170288 | A1* | 5/2024 | Farooq | H01L 23/535 |
| 2024/0312804 | A1* | 9/2024 | Tanoue | H01L 21/02 |

FOREIGN PATENT DOCUMENTS

| | | | | |
|---|---|---|---|---|
| JP | 2016-525801 A | | 8/2016 | |
| JP | 2019-126844 A | | 8/2019 | |
| KR | 10-2020-0047554 A | | 5/2020 | |
| WO | 2015014265 A1 | | 2/2015 | |
| WO | 2015182558 A1 | | 12/2015 | |
| WO | WO 2022/153886 | * | 7/2022 | H01L 21/02 |
| WO | WO 2022/153894 | * | 7/2022 | H01L 21/02 |
| WO | WO 2022/153895 | * | 7/2022 | H01L 21/02 |

* cited by examiner

SUBSTRATE PROCESSING APPARATUS, SUBSTRATE PROCESSING METHOD, AND SUBSTRATE MANUFACTURING METHOD

CROSS-REFERENCE TO RELATED APPLICATIONS

This Application is a U.S. national phase application under 35 U.S.C. § 371 of PCT Application No. PCT/JP2022/000014 filed on Jan. 4, 2022, which claims the benefit of Japanese Patent Application No. 2021-005325 filed on Jan. 15, 2021 the entire disclosures of which are incorporated herein by reference.

TECHNICAL FIELD

The various aspects and embodiments described herein pertain generally to a substrate processing apparatus, a substrate processing method, and a substrate manufacturing method.

BACKGROUND

Patent Document 1 discloses a manufacturing method for a semiconductor device. This manufacturing method includes a heating process of locally heating a separation oxide film by radiating a $CO_2$ laser from a rear surface of a semiconductor substrate, and a transferring process of transferring a semiconductor element to a transfer destination substrate by causing separation in the separation oxide film and/or separation at an interface between the separation oxide film and the semiconductor substrate.

PRIOR ART DOCUMENT

Patent Document 1: Japanese Patent Laid-open Publication No. 2007-220749

DISCLOSURE OF THE INVENTION

Means for Solving the Problems

In an exemplary embodiment, a substrate processing apparatus configured to process a combined substrate in which a first substrate and a second substrate are bonded to each other includes a substrate holder configured to hold the combined substrate; a laser radiating unit configured to radiate laser light in a pulse shape to a laser absorbing layer formed between the first substrate and the second substrate; a moving mechanism configured to move the substrate holder and the laser radiating unit relative to each other; and a controller configured to control the laser radiating unit and the moving mechanism. The controller sets an interval of the laser light radiated to the laser absorbing layer based on a thickness of the laser absorbing layer.

DETAILED DESCRIPTION

Figure 1:
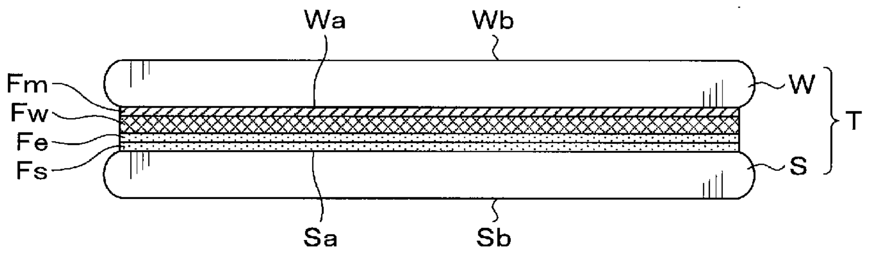
FIG. 1 is a side view illustrating a schematic structure of a combined wafer to be processed in a wafer processing system.

In a manufacturing process for a semiconductor device, there is performed a process of transferring a device layer on a front surface of a first substrate (a silicon substrate such as a semiconductor substrate) to a second substrate in a combined substrate in which the first substrate having a plurality of devices such as electronic circuits formed on the front surface thereof and the second substrate are bonded to each other. At this time, a so-called laser lift-off processing of separating the first substrate from the second substrate by using laser light, for example, may be performed. In this laser lift-off processing, the laser light is radiated to a laser absorption layer (for example, an oxide film) formed between the first substrate and the second substrate, causing separation at an interface between the first substrate and the second substrate.

The method described in Patent Document 1 mentioned above is a manufacturing method for a semiconductor device using this laser lift-off processing. Patent Document 1 describes performing a stable laser processing by setting the thickness of the oxide film to be large so as to suppress a fluctuation in the characteristics of semiconductor elements in the device layer as well as a damage thereto. However, nothing is considered or mentioned about improving the throughput of this laser processing. Thus, the conventional laser processing still has a room for improvement.

The present disclosure provides a technique capable of improving the throughput of the substrate processing using laser light for a combined substrate in which a first substrate and a second substrate are bonded to each other. Hereinafter, a wafer processing apparatus as a substrate processing apparatus, a wafer processing method as a substrate processing method, and a wafer manufacturing method as a substrate manufacturing method according to an exemplary embodiment will be described with reference to the accompanying drawings. Further, in the specification and the drawings, parts having substantially the same functions and configurations will be assigned same reference numerals, and redundant description will be omitted.

A wafer processing system 1 according to the present exemplary embodiment to be described later is configured to perform a processing on a combined wafer T as a combined substrate in which a first wafer W as a first substrate and a second wafer S as a second substrate are bonded to each other, as shown in FIG. 1. Hereinafter, in the first wafer W, a surface to be bonded to the second wafer S will be referred to as a front surface Wa, and a surface opposite to the front surface Wa will be referred to as a rear surface Wb. Likewise, in the second wafer S, a surface to be bonded to the first wafer W will be referred to as a front surface Sa, and a surface opposite to the front surface Sa will be referred to as a rear surface Sb.

The first wafer W is a semiconductor wafer such as, but not limited to, a silicon wafer. A separation facilitating film Fm, a laser absorbing film Fw as a laser absorbing layer, a device layer (not shown) including a plurality of devices, and a surface film Fe are formed on the front surface Wa of the first wafer W. A film which is transmissive to laser light from a laser radiation system 110 to be described later and whose adhesiveness to the first wafer W (silicon) is at least smaller than adhesiveness to the laser absorbing film Fw, for example, a SiN film is used as the separation facilitating film Fm. A film capable of absorbing the laser light from the laser radiation system 110 to be described later, for example, an oxide film (a $SiO_2$ film, a TEOS film) or the like is used as the laser absorbing film Fw. The surface film Fe may be, by way of non-limiting example, an oxide film (a THOX film, a $SiO_2$ film, a TEOS film, etc.), a SiC film, a SiCN film, or an adhesive.

The second wafer S is also a semiconductor wafer such as, but not limited to, a silicon substrate. A device layer (not shown) including a plurality of devices is formed on the front surface Sa of the second wafer S, and a surface film Fs is also formed thereon. The surface film Fs may be, by way of non-limiting example, an oxide film (a THOX film, a $SiO_2$ film, a TEOS film, etc.), a SiC film, a SiCN film, or an adhesive. The surface film Fe of the first wafer W and the surface film Fs of the second wafer S are bonded.

Figure 2:
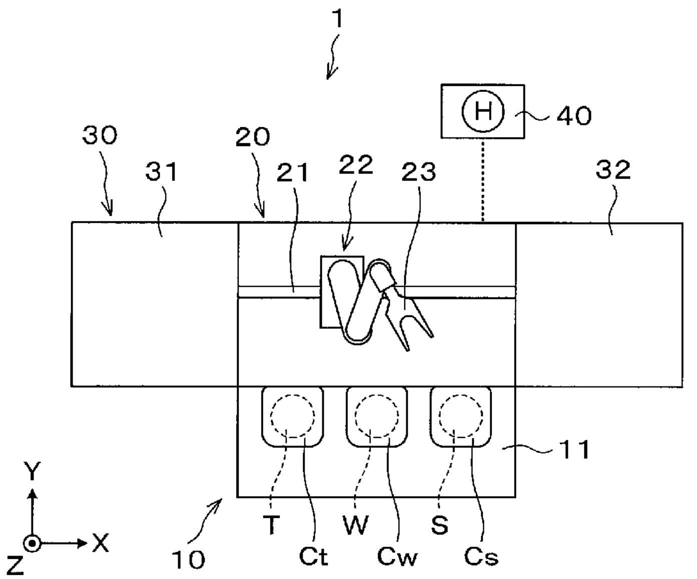
FIG. 2 is a plan view schematically illustrating a configuration of the wafer processing system.

As depicted in FIG. 2, the wafer processing system 1 has a configuration in which a carry-in/out block 10, a transfer block 20, and a processing block 30 are connected as one body. The carry-in/out block 10 and the processing block 30 are disposed around the transfer block 20. Specifically, the carry-in/out block 10 is disposed on the negative Y-axis side of the transfer block 20. A wafer processing apparatus 31 of the processing block 30 to be described later is disposed on the negative X-axis side of the transfer block 20, and a cleaning apparatus 32 to be described later is disposed on the positive X-axis side of the transfer block 20.

In the carry-in/out block 10, cassettes Ct, Cw, and Cs capable of accommodating therein a plurality of combined wafers T, a plurality of first wafers W, and a plurality of second wafers S, respectively, are carried to/from, for example, the outside. In the carry-in/out block 10, a cassette placing table 11 is disposed. In the shown example, a plurality of, for example, three cassettes Ct, Cw, and Cs can be arranged on the cassette placing table 11 in a row in the X-axis direction. Here, the number of the cassettes Ct, Cw, and Cs disposed on the cassette placing table 11 is not limited to the example of the present exemplary embodiment and may be selected as required.

The transfer block 20 is equipped with a wafer transfer device 22 configured to be movable on a transfer path 21 which is elongated in the X-axis direction. The wafer transfer device 22 has, for example, two transfer arms 23 configured to hold and transfer the combined wafer T, the first wafer W, and the second wafer S. Each transfer arm 23 is configured to be movable in a horizontal direction and a vertical and pivotable around a horizontal axis and a vertical axis. In addition, the structure of the transfer arm 23 is not limited to the example of the present exemplary embodiment, and various other structures may be adopted. Moreover, the wafer transfer device 22 is configured to transfer the combined wafer T, the first wafer W and the second wafer S to/from the cassettes Ct, Cw and Cs of the cassette placing table 11, and the wafer processing apparatus 31 and the cleaning apparatus 32 to be described later.

The processing block 30 has the wafer processing apparatus 31 and the cleaning apparatus 32. The wafer processing apparatus 31 is configured to radiate laser light to the laser absorbing film Fw of the first wafer W to separate the first wafer W from the second wafer S. The configuration of the wafer processing apparatus 31 will be described later.

The cleaning apparatus 32 is configured to clean the outermost surface (the surface of the separation facilitating film Fm) on the front surface Sa side of the second wafer S separated by the wafer processing apparatus 31. For example, by bringing a brush into contact with the surface of the separation facilitating film Fm, the surface is scrub-cleaned. In addition, a pressurized cleaning liquid may be used for the cleaning of the surface of the separation facilitating film Fm. Furthermore, the cleaning apparatus 32 may be configured to clean the rear surface Sb of the second wafer S as well as the front surface Sa.

The above-described wafer processing system 1 is equipped with a control device 40 as a controller. The control device 40 is, for example, a computer, and has a program storage (not shown). A program for controlling a processing of the combined wafer T in the wafer processing system 1 is stored in the program storage. Further, the program storage also stores therein a program for implementing a wafer processing to be described later in the wafer processing system 1 by controlling operations of the above-described various kinds of processing apparatuses and a driving system such as the transfer devices. In addition, the programs may be recorded in a computer-readable recording medium H, and may be installed from this recording medium H to the control device 40.

Now, the aforementioned wafer processing apparatus 31 will be explained.

Figure 3:
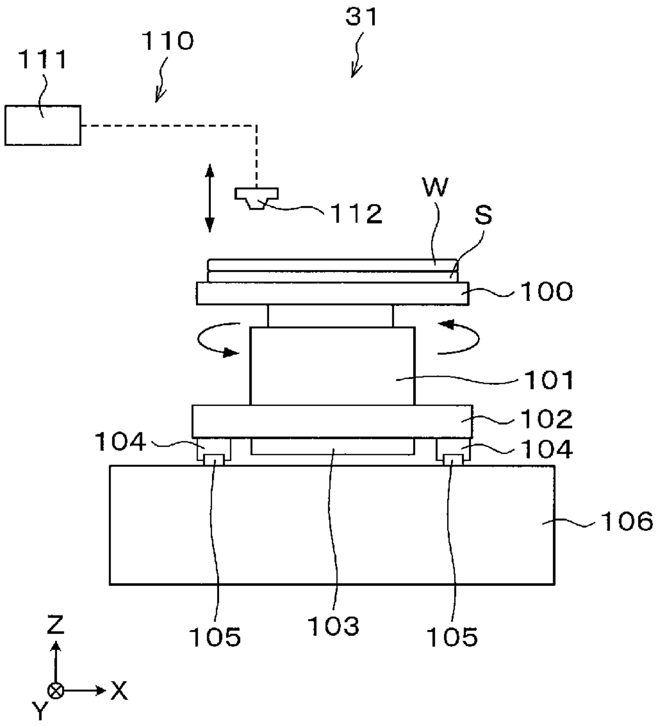
FIG. 3 is a side view illustrating a schematic configuration of a wafer processing apparatus.
Figure 4:
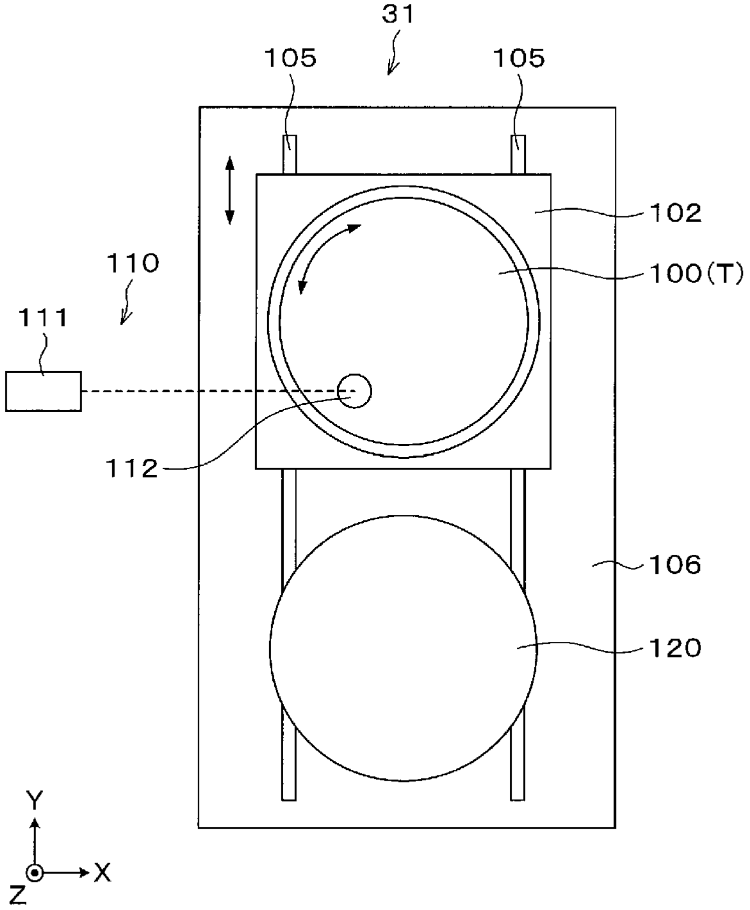
FIG. 4 is a plan view illustrating the schematic configuration of the wafer processing apparatus.

As illustrated in FIG. 3 and FIG. 4, the wafer processing apparatus 31 includes a chuck 100 as a substrate holder configured to hold the combined wafer T on a top surface thereof. The chuck 100 is configured to attract and hold the rear surface Sb of the second wafer S.

The chuck 100 is supported by a slider table 102 with an air bearing 101 therebetween. A rotating mechanism 103 is provided on a bottom surface of the slider table 102. The rotating mechanism 103 incorporates therein, for example, a motor as a driving source. The chuck 100 is configured to be rotated about a θ axis (vertical axis) by the rotating mechanism 103 via the air bearing 101 therebetween. The slider table 102 is configured to be moved by a horizontally moving mechanism 104, which is provided on a bottom surface thereof, along a rail 105 which is elongated in the Y-axis direction. The rail 105 is provided on a base 106. In addition, though not particularly limited, a driving source of the horizontally moving mechanism 104 may be, by way of non-limiting example, a linear motor. Further, in the present exemplary embodiment, the aforementioned rotating mechanism 103 and horizontally moving mechanism 104 correspond to a "moving mechanism" according to the present disclosure.

A laser radiation system 110 serving as a laser radiating unit is provided above the chuck 100. The laser radiation system 110 has a laser head 111, and a lens 112 as a laser radiating unit. The lens 112 may be configured to be movable up and down by an elevating mechanism (not shown).

The laser head 111 has a laser oscillator (not shown) configured to oscillate laser light in a pulse shape. That is, the laser light radiated from the laser radiation system 110 to the combined wafer T held by the chuck 100 is a so-called pulse laser, and its power is repeatedly switched between 0 (zero) and the maximum. In the present exemplary embodiment, the laser light is $CO_2$ laser light, and the wavelength of the $CO_2$ laser light is in the range of, for example, 8.9 μm to 11 μm. Further, the laser head 111 may have other devices of the laser oscillator such as, but not limited to, an amplifier.

The lens 112 is a cylindrical member, and radiates the laser light to the combined wafer T held by the chuck 100. The laser light emitted from the laser radiation system 110 penetrates the first wafer W to be radiated to and absorbed by the laser absorbing film Fw.

As illustrated in FIG. 4, a transfer pad 120 serving as a separation processing unit is disposed above the chuck 100. The transfer pad 120 is configured to be movable up and down by an elevating mechanism (not shown). Further, the transfer pad 120 has an attraction surface for the first wafer W. The transfer pad 120 transfers the first wafer W between the chuck 100 and the transfer arm 23. Specifically, after the chuck 100 is moved to a position (a transfer position with respect to the transfer arm 23) below the transfer pad 120, the transfer pad 120 attracts and holds the rear surface Wb of the first wafer W, and separates the first wafer W from the second wafer S. Then, the separated first wafer W is transferred from the transfer pad 120 to the transfer arm 23, and is carried out from the wafer processing apparatus 31.

In the present exemplary embodiment, although the laser radiating unit (laser radiation system 110) and the separation processing unit (transfer pad 120) are both provided inside the wafer processing apparatus 31, the laser radiating unit and the separation processing unit may be provided as another processing apparatus.

Now, a wafer processing performed by using the wafer processing system 1 having the above-described configuration will be discussed. In the present exemplary embodiment, the first wafer W and the second wafer S are bonded in a bonding apparatus (not shown) outside the wafer processing system 1 to form the combined wafer T in advance.

First, the cassette Ct accommodating therein the plurality of combined wafers T is placed on the cassette placing table 11 of the carry-in/out block 10.

Then, the combined wafer T in the cassette Ct is taken out by the wafer transfer device 22, and transferred to the wafer processing apparatus 31. In the wafer processing apparatus 31, the combined wafer T is handed over to the chuck 100 from the transfer arm 23, and attracted to and held by the chuck 100. Subsequently, the chuck 100 is moved to a processing position by the horizontally moving mechanism 104. This processing position is a position where the laser light can be radiated from the laser radiation system 110 to the combined wafer T (laser absorbing film Fw).

Figure 5:
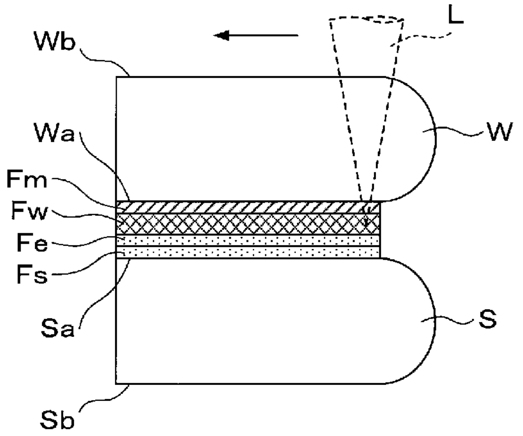
FIG. 5 is an explanatory diagram illustrating a state in which laser light is radiated to a laser absorbing film.
Figure 6:
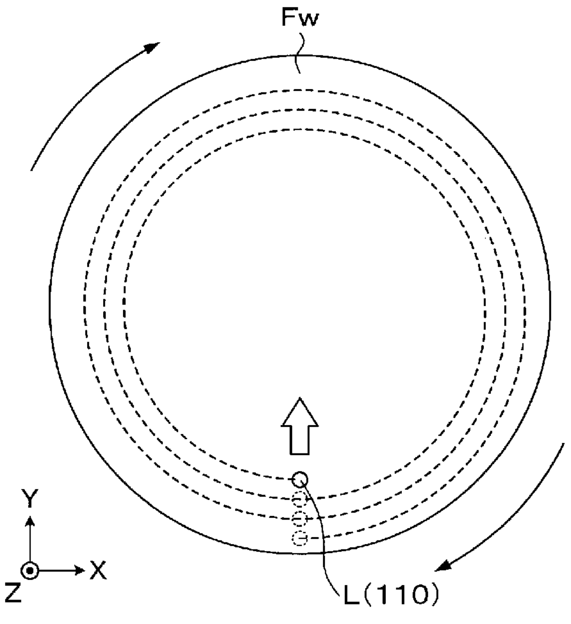
FIG. 6 is an explanatory diagram illustrating a state in which laser light is radiated to the laser absorbing film.

Next, as shown in FIG. 5 and FIG. 6, laser light L is radiated in a pulse shape from the laser radiation system 110 to the laser absorbing film Fw. At this time, the laser light L penetrates the first wafer W and the separation facilitating film Fm from the rear surface Wb side of the first wafer W, and is absorbed by the laser absorbing film Fw. At this time, the laser absorbing film Fw accumulates energy by absorbing the laser light L, so that the temperature of the laser absorbing film Fw rises so that the laser absorbing film Fw is expanded. The shear stress generated by the expansion of the laser absorbing film Fw is also transmitted to the separation facilitating film Fm. Since the adhesive strength of the separation facilitating film Fm to the first wafer W is smaller than the adhesive strength of the separation facilitating film Fm to the laser absorbing film Fw, separation occurs at an interface between the first wafer W and the separation facilitating film Fm.

When radiating the laser light L to the laser absorbing film Fw, the chuck 100 (combined wafer T) is rotated by the rotating mechanism 103, and the chuck 100 is moved in the Y-axis direction by the horizontally moving mechanism 104. Accordingly, the laser light L is radiated to the laser absorbing film Fw from a diametrically outer side toward a diametrically inner side thereof, and, as a result, the laser light L is radiated in a spiral shape from the outer side toward the inner side. Further, a black-colored arrow shown in FIG. 6 indicates a rotation direction of the chuck 100.

The laser light L may be annularly radiated in concentric circles. Further, the laser light L may be radiated to the laser absorbing film Fw from the diametrically inner side toward the diametrically outer side thereof. In addition, after the laser light L is radiated in a fan shape with the center of the laser absorbing film Fw as a pivot, the chuck 100 may be moved, and the laser light Lis radiated in a fan shape again to a portion of the laser absorbing film Fw yet to be radiated with the laser light L. By repeating this radiation of the laser light L and moving of the chuck 100, the laser light L may be radiated to the entire laser absorbing film Fw. Further, by radiating the laser light L in a straight line shape while moving the chuck 100, the laser light L may be radiated to the entire laser absorbing film Fw.

Moreover, in the present exemplary embodiment, although the chuck 100 is rotated in radiating the laser light L to the laser absorbing film Fw, the lens 112 may be rotated relative to the chuck 100 by moving the lens 112. Further, although the chuck 100 is moved in the Y-axis direction, the lens 112 may be moved in the Y-axis direction.

In this way, in the wafer processing apparatus 31, the laser light L is radiated into the laser absorbing film Fw in the pulse shape. Further, when the laser light L is oscillated in the pulse shape, a peak power (maximum intensity of the laser light) may be set to be high to cause the separation at the interface between the first wafer W and the separation facilitating film Fm. As a result, the first wafer W can be appropriately separated from the second wafer S.

Furthermore, in the present exemplary embodiment, as for the laser light L radiated to the laser absorbing film Fw, an interval in a circumferential direction (pulse pitch) and an interval in a radial direction (index pitch) are set based on the thickness of the laser absorbing film Fw. A method of setting the pulse pitch and the index pitch will be described later.

Figure 7A:
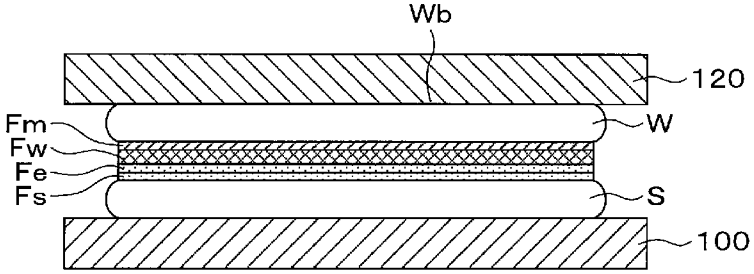
FIG. 7A and FIG. 7B are explanatory diagrams illustrating a state in which a first wafer is separated from a second wafer.
Figure 7B:
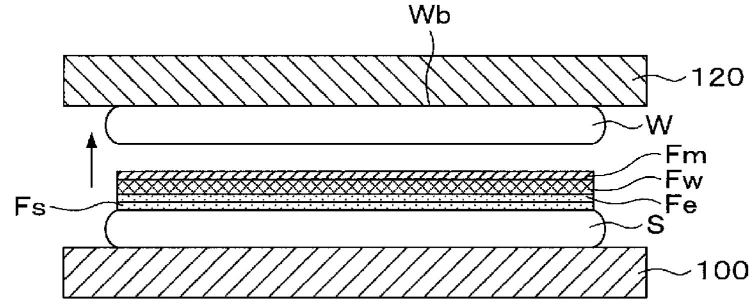

After the laser light L is radiated to the laser absorbing film Fw as described above, the chuck 100 is then moved to a delivery position by the horizontally moving mechanism 104. Then, the rear surface Wb of the first wafer W is attracted to and held by the transfer pad 120, as shown in FIG. 7A. Thereafter, by raising the transfer pad 120 in the state that the first wafer W is attracted to and held by the transfer pad 120 as shown in FIG. 7B, the first wafer W is separated from the separation facilitating film Fm. At this time, since the separation has occurred at the interface between the first wafer W and the separation facilitating film Fm as a result of the radiation of the laser light L, the first wafer W can be separated from the separation facilitating film Fm without applying a large load. Also, the device layer of the first wafer W is transferred to the second wafer S. Further, when raising the transfer pad 120, the transfer pad 120 may be rotated about a vertical axis to thereby separate the first wafer W.

The separated first wafer W is handed over to the transfer arm 23 of the wafer transfer device 22 from the transfer pad 120, and is then transferred to the cassette Cw of the cassette placing table 11. Further, the first wafer W carried out from the wafer processing apparatus 31 is transferred to the cleaning apparatus 32 before being transferred to the cassette Cw so that the front surface Wa thereof as a separation surface may be cleaned. In this case, the first wafer W may be handed over to the transfer arm 23 with the front and rear surfaces thereof inverted by the transfer pad 120.

Meanwhile, the second wafer S held by the chuck 100 is delivered to the transfer arm 23, and is transferred to the cleaning apparatus 32. In the cleaning apparatus 32, the outermost surface (the front surface of the separation facilitating film Fm) on the front surface Sa side as a separation surface is scrub-cleaned. In addition, in the cleaning apparatus 32, the rear surface Sb of the second wafer S may be cleaned together with the front surface of the separation facilitating film Fm. Further, a cleaning unit configured to clean the front surface of the separation facilitating film Fm and a cleaning unit configured to clean the rear surface Sb of the second wafer S may be separately provided.

Thereafter, the second wafer S after being subjected to all the required processes is transferred to the cassette Cs of the cassette placing table 11 by the wafer transfer device 22. In this way, the series of processes of the wafer processing in the wafer processing system 1 are ended.

Figure 8:
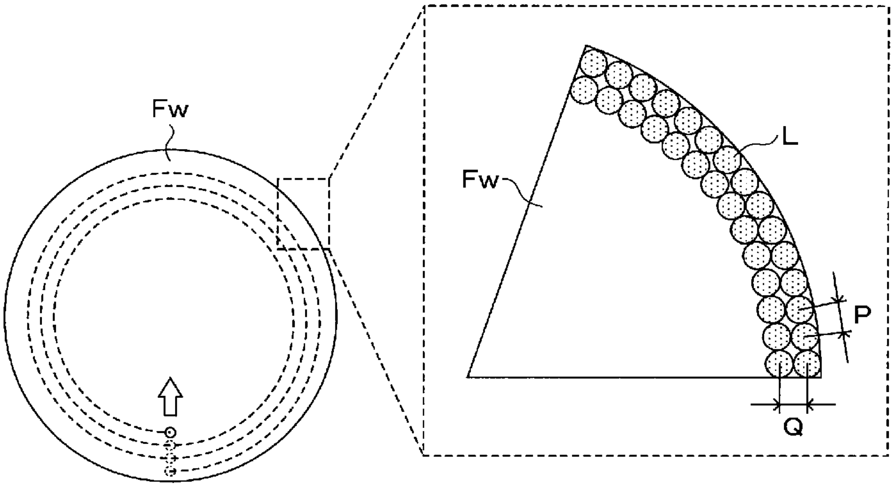
FIG. 8 is an explanatory diagram for describing a radiation interval of the laser light radiated to the laser absorbing film.

Now, when the laser light L is radiated to the laser absorbing film Fw in the wafer processing apparatus 31, the method of setting a pulse pitch P as the radiation interval of the laser light L in the circumferential direction and an index pitch Q as the radiation interval of the laser light L in the radial direction shown in FIG. 8 will be described.

Figure 9:
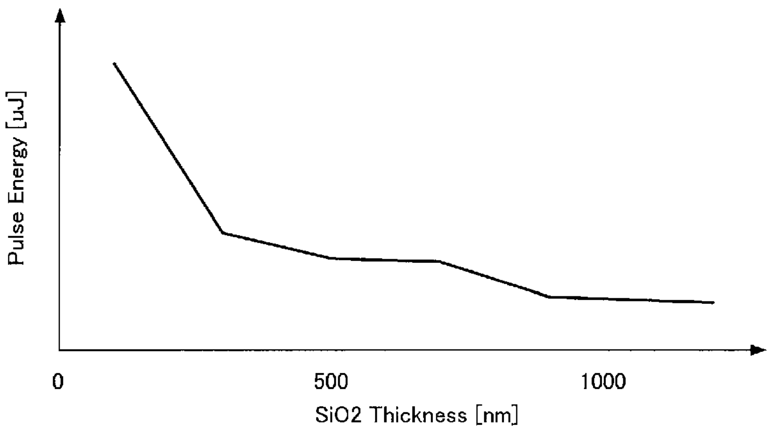
FIG. 9 is a graph showing a tendency of a relationship between the thickness of the laser absorbing film and a pulse energy of the laser light.

First, the present inventors have investigated a pulse energy (vertical axis in FIG. 9) of the laser light L required to separate the first wafer W from the second wafer S when the thickness (horizontal axis in FIG. 9) of the laser absorbing film Fw ($SiO_2$ film) is varied as shown in FIG. 9. When the thickness of the laser absorbing film Fw is small, the pulse energy required for the separation increases because the volume in which the pulse energy is absorbed is small so the absorption efficiency is low. On the other hand, when the thickness of the laser absorbing film Fw is large, the pulse energy required for the separation becomes small.

Figure 10:
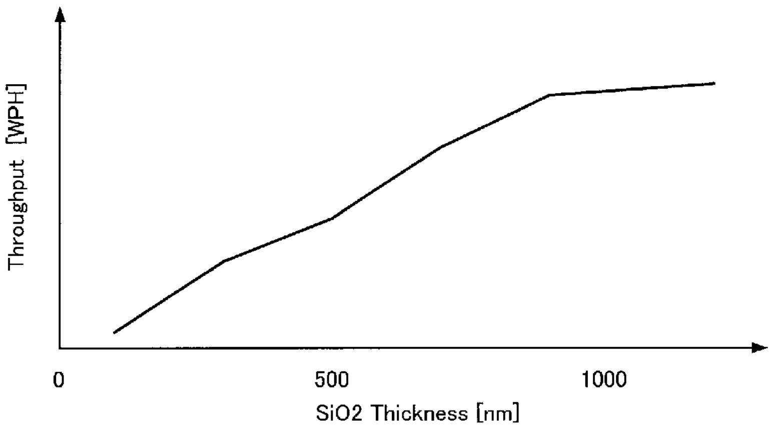
FIG. 10 is a graph showing a tendency of a relationship between the thickness of the laser absorbing film and a throughput of a wafer processing.

Then, the present inventors have investigated a throughput (vertical axis of FIG. 10) of the wafer processing when the thickness (horizontal axis of FIG. 10) of the laser absorbing film Fw ($SiO_2$ film) is varied as shown in FIG. 10. As stated above, when the thickness of the laser absorbing film Fw is small, the pulse energy required for the separation increases. In this case, since it is necessary to reduce the pulse frequency of the laser light L to increase the pulse energy, the throughput of the wafer processing is reduced. On the other hand, when the thickness of the laser absorbing film Fw is large, the pulse energy required for the separation is small so the pulse frequency of the laser light L can be increased, so that the throughput of the wafer processing is improved.

Figure 11:
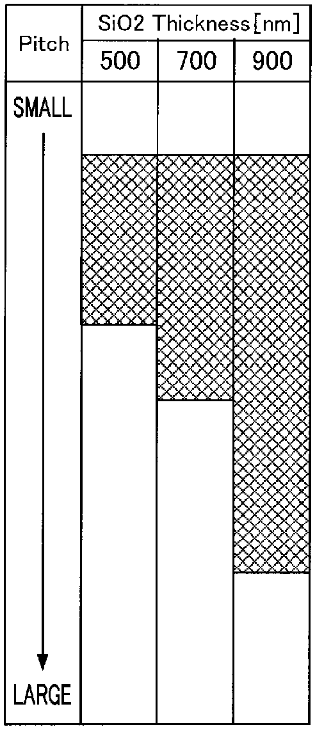
FIG. 11 presents a table showing a correlation between the thickness of the laser absorbing film and the radiation interval of the laser light.

As described above, there is a correlation between the thickness of the laser absorbing film Fw and the throughput of the wafer processing. Through further intensive studies, the present inventors have found that there is a correlation between the thickness of the laser absorbing film Fw ($SiO_2$ film) and the pulse pitch P and the index pitch Q of the laser light L, which enables the separation, as shown in FIG. 11. That is, the first wafer W can be separated from the second wafer S according to the thickness of the laser absorbing film Fw. For example, the first wafer W can be separated from the second wafer S within the range of the pulse pitch P and the index pitch Q indicated by shaded portions in FIG. 11. In addition, in the example shown in FIG. 11, although the pulse pitch P and the index pitch Q are same, they may be different.

The method of setting the pulse pitch P and the index pitch Q of the present exemplary embodiment is based on the above observations, and the pulse pitch P and the index pitch Q are set based on the thickness of the laser absorbing film Fw.

First, the thickness of the laser absorbing film Fw is acquired. The thickness of the laser absorbing film Fw may be obtained in the wafer processing apparatus 31 or obtained at an outside of the wafer processing apparatus 31 in advance. Further, the acquisition method for the thickness of the laser absorbing film Fw is not particularly limited, and the thickness may be directly or indirectly measured by, for example, a sensor or the like, or obtained by taking an image of the combined wafer T with a camera or the like. Then, the obtained thickness of the laser absorbing film Fw is outputted to the controller 40.

In the controller 40, the pulse pitch P and the index pitch Q are set based on the obtained thickness of the laser absorbing film Fw. By way of example, the pulse pitch P and the index pitch Q may be set such that a processing time for the wafer processing using the laser light (that is, a laser processing time in the present disclosure) is minimized while the throughput is maximized. For example, in the example shown in FIG. 11, the pulse pitch P and the index pitch Q are set to maximum values enabling the separation according to the thickness of the laser absorbing film Fw. In this case, productivity can be improved by maximizing the throughput of the wafer processing. Further, the pulse pitch P and the index pitch Q may be the same as or different from each other as described above.

As another example, the pulse pitch P and the index pitch Q may be set such that the processing time (throughput) of the wafer processing becomes a processing time (throughput) required of the wafer processing apparatus 31. In this case, it is possible to maximize the performance of the wafer processing apparatus 31 while ensuring the throughput of the wafer processing.

According to the present exemplary embodiment as described above, since the pulse pitch P and the index pitch Q of the laser light L are set based on the thickness of the laser absorbing film Fw, the throughput of the wafer processing can be controlled appropriately.

Now, a manufacturing method of the combined wafer T based on the knowledge that there is the above-described correlation between the thickness of the laser absorbing film Fw and the pulse pitch P and the index pitch Q of the laser light L will be explained.

In the bonding apparatus (not shown) outside the wafer processing system 1, the first wafer W and the second wafer S are bonded to produce the combined wafer T. At this time, the first wafer W is provided with the separation facilitating film Fm, the laser absorbing film Fw, the device layer (not shown) and the surface film Fe that are stacked on the front surface Wa thereof. Further, the second wafer S is provided with the device layer (not shown) and the surface film Fs that are stacked on the front surface Sa thereof. Then, the surface film Fe of the first wafer W and the surface film Fs of the second wafer S are bonded.

The thickness of the laser absorbing film Fw is set based on the pulse pitch P and the index pitch Q of the laser light L radiated to the laser absorbing film Fw in the wafer processing apparatus 31 after the combed wafer T is produced. That is, the thickness of the laser absorbing film Fw is set based on the pulse pitch P and the index pitch Q set from the processing time (throughput) of the wafer processing in the wafer processing apparatus 31 as described above, by using the correlation shown in FIG. 11, for example.

According to the present exemplary embodiment as described above, since the thickness of the laser absorbing film Fw can be set optimally based on the pulse pitch P and the index pitch Q of the laser light L, the throughput of the wafer processing in the wafer processing apparatus 31 can be appropriately controlled.

Further, in the above-described exemplary embodiment, the method of setting the pulse pitch P and the index pitch Q according to the present disclosure is applied when the first wafer W is separated from the second wafer S by radiating the laser light L to the laser absorbing film Fw in the combined wafer T, that is, when the laser lift-off is performed. However, the laser processing to which the setting method of the present disclosure is applicable is not limited thereto.

Figure 12A:
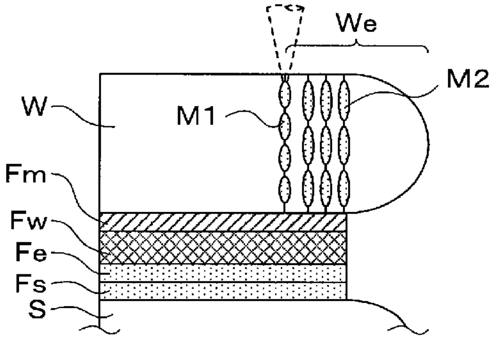
FIG. 12A to FIG. 12C are explanatory diagrams illustrating main processes of another wafer processing in the wafer processing system.
Figure 12B:
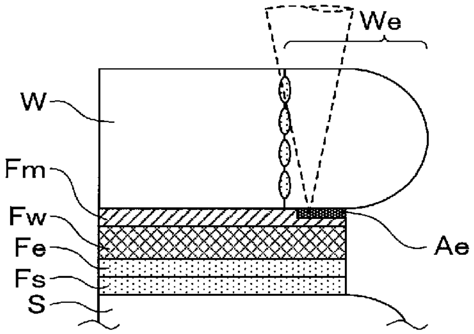
Figure 12C:
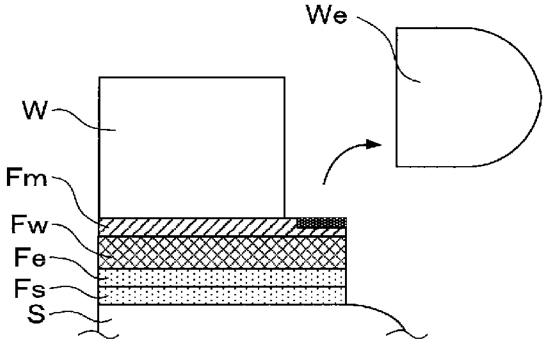

For example, the method of setting the pulse pitch P and the index pitch Q according to the present disclosure may also be applied when performing so-called edge trimming of removing a peripheral portion We of the first wafer W in the combined wafer T, as shown in FIG. 12A to FIG. 12C. Here, the peripheral portion We of the first wafer W is in the range of, e.g., 0.5 mm to 3 mm from an outer end of the first wafer W in the radial direction.

Specifically, as shown in FIG. 12A, by radiating laser light (for example, YAG laser light) to an inside of the first wafer W, a peripheral modification layer M1 and a split modification layer M2 are formed. The peripheral modification layer M1 is formed in an annular shape on a circle concentric with the first wafer W. The split modification layer M2 is formed by being extended from the peripheral modification layer M1 in the radial direction.

Then, as illustrated in FIG. 12B, by radiating laser light (for example, $CO_2$ laser light) in a pulse shape to a portion of the laser absorbing film Fw corresponding to the peripheral portion We, a non-bonding region Ae in which the bonding strength between the first wafer W and the second wafer S is reduced is formed.

Thereafter, as depicted in FIG. 12C, removal of the peripheral portion We of the first wafer W, that is, edge trimming is performed. At this time, the peripheral portion We is separated from the central portion of the first wafer W starting from the peripheral modification layer M1, and completely separated from the second wafer S starting from the non-bonding region Ae. At this time, the peripheral portion We being removed is broken into smaller pieces starting from the split modification layer M2.

In the present exemplary embodiment, when the laser light is radiated to the laser absorbing film Fw as shown in FIG. 12B, the pulse pitch P and index pitch Q of the laser light set based on the laser absorbing film Fw, the same as in the above-described exemplary embodiment. As a result, the same effect as obtained in the above-described exemplary embodiment can be achieved. That is, the throughput of the wafer processing can be improved.

Figure 13A:
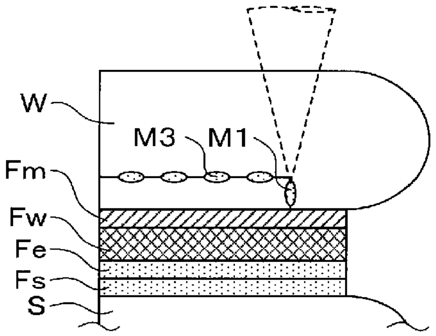
FIG. 13A to FIG. 13C are explanatory diagrams illustrating main processes of still another wafer processing in the wafer processing system.
Figure 13B:
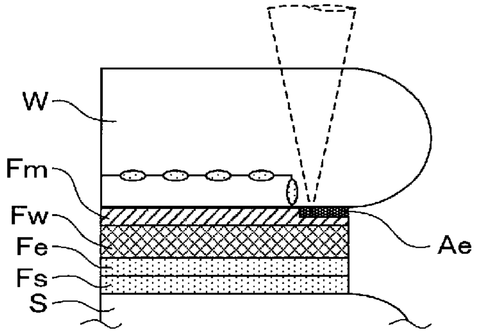
Figure 13C:
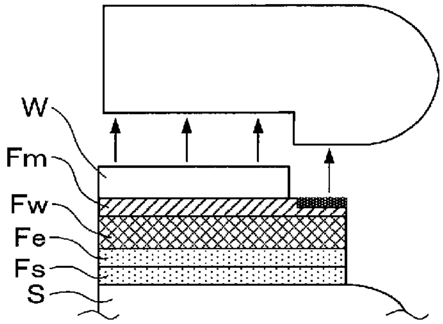

As another example, the method of setting the pulse pitch P and the index pitch Q according to the present disclosure may also be applied when forming, within the first wafer W, an internal modification layer M3 serving as a starting point of thinning of the first wafer W while removing the peripheral portion We as one body with the rear surface Wb side of the first wafer W, as illustrated in FIG. 13A to FIG. 13C.

Specifically, as shown in FIG. 13A, by radiating laser light to the inside of the first wafer W, the peripheral modification layer M1 and the internal modification layer M3 are sequentially formed. The internal modification layer M3 is extended in a plane direction within the first wafer W.

Subsequently, as shown in FIG. 13B, by radiating laser light (for example, $CO_2$ laser light) in a pulse shape to a portion of the laser absorbing film Fw corresponding to the peripheral portion We, a non-bonding region Ae is formed.

Thereafter, as depicted in FIG. 13C, the first wafer W is thinned starting from the internal modification layer M3, and the peripheral portion We is removed as one body starting from the peripheral modification layer M1 and the non-bonding region Ae.

In the present exemplary embodiment, when radiating the laser light to the laser absorbing film Fw as shown in FIG. 13B, the pulse pitch P and the index pitch Q of the laser light is set based on the laser absorbing film Fw, the same as in the above-described exemplary embodiment. As a result, the same effect as obtained in the above-described exemplary embodiment can be achieved. That is, the throughput of the wafer processing can be improved. Further, in the present exemplary embodiment, the device layer is formed on the front surface Wa of the first wafer W. However, the technique of the present disclosure can also be applied to a case of performing the same processing on an SOI wafer on which no device layer is formed, for example.

In addition, in the example shown in FIG. 12A to FIG. 12C, the order of the formation of the peripheral modification layer M1 and the split modification layer M2 of FIG. 12A and the formation of the non-bonding region Ae of FIG. 12B may be reversed. Likewise, in the example shown in FIG. 13A to FIG. 13C, the order of the formation of the peripheral modification layer M1 and the internal modification layer M3 of FIG. 13A and the formation of the non-bonding region Ae of FIG. 13B may be reversed.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to improve the throughput of the substrate processing using the laser light on the combined substrate in which the first substrate and the second substrate are bonded to each other.

We claim:

1. A substrate processing apparatus configured to process a combined substrate in which a first substrate and a second substrate are bonded to each other, the substrate processing apparatus comprising:

a substrate holder configured to hold the combined substrate;

a laser radiating unit configured to radiate laser light in a pulse shape to a laser absorbing layer formed between the first substrate and the second substrate;

a moving mechanism configured to move the substrate holder and the laser radiating unit relative to each other;

a controller and a storage storing a computer program, wherein the storage and the computer program are configured, with the controller, to control the laser radiating unit and the moving mechanism; and a thickness information obtaining unit configured to obtain thickness information related to a thickness of the laser absorbing layer, wherein the controller sets a pitch of the laser light radiation, which corresponds to a distance between adjacent laser radiation spots within the laser absorbing layer, based on the thickness information.

2. The substrate processing apparatus of claim 1, wherein the moving mechanism comprises:

a rotating mechanism configured to rotate the substrate holder and the laser radiating unit relative to each other; and a horizontally moving mechanism configured to move the substrate holder and the laser radiating unit in a horizontal direction relative to each other, and wherein the controller sets, as the pitch of the laser light radiation, a pitch in a circumferential direction and a pitch in a radial direction.

3. The substrate processing apparatus of claim 1, wherein the controller sets the pitch of the laser light radiation based on the thickness of the laser absorbing layer such that a laser processing time of the combined substrate is minimized.

4. The substrate processing apparatus of claim 1, wherein the controller sets the pitch of the laser light radiation based on the thickness of the laser absorbing layer such that a laser processing time of the combined substrate becomes a laser processing time required in the substrate processing apparatus.

5. The substrate processing apparatus of claim 1, wherein the controller is configured to set the pitch of the laser light radiation based on a correlation between the thickness of the laser absorbing layer and the pitch of the laser light, which enables the separation of the first substrate and the second substrate.

6. A substrate processing method of radiating laser light to a laser absorbing layer formed between a first substrate and a second substrate in a combined substrate in which the first substrate and the second substrate are bonded to each other, the substrate processing method comprising:

obtaining thickness information comprising a thickness of the laser absorbing layer;

setting a pulse pitch and an index pitch of the laser light radiation within the laser absorbing layer based on the thickness of the laser absorbing layer, the pulse pitch corresponding to a distance in a circumferential direction between adjacent laser radiation spots, and the index pitch corresponding to a distance in a radial direction between adjacent laser radiation spots; and radiating the laser light to the laser absorbing layer at the pulse pitch and the index pitch of the laser light radiation.

7. The substrate processing method of claim 6, wherein the laser light is radiated to the laser absorbing layer from a laser radiating unit while relatively rotating a substrate holder configured to hold the combined substrate and the laser radiating unit configured to radiate the laser light so as to achieve the pulse pitch, and the laser light is radiated to the laser absorbing layer from the laser radiating unit while relatively moving the substrate holder and the laser radiating unit in a horizontal direction so as to achieve the index pitch.

8. The substrate processing method of claim 6, wherein the pulse pitch and the index pitch of the laser light radiation is set based on the thickness of the laser absorbing layer such that a laser processing time of the combined substrate is minimized.

9. The substrate processing method of claim 6, wherein the pulse pitch and the index pitch of the laser light radiation is set based on the thickness of the laser absorbing layer such that a laser processing time of the combined substrate becomes a laser processing time required in a substrate processing apparatus.

10. A substrate manufacturing method of manufacturing a combined substrate in which a first substrate and a second substrate are bonded to each other, the substrate manufacturing method comprising:

forming a laser absorbing layer between the first substrate and the second substrate and bonding the first substrate and the second substrate to form the combined substrate;

radiating laser light to the laser absorbing layer in a pulse shape after the first substrate and the second substrate are bonded to each other; and setting a thickness of the laser absorbing layer based on a pulse pitch and an index pitch of the laser light radiation within the laser absorbing layer, the pulse pitch corresponding to a distance in a circumferential direction between adjacent laser radiation spots, and the index pitch corresponding to a distance in a radial direction between adjacent laser radiation spots, wherein the thickness of the laser absorbing layer is set based on a correlation between the thickness of the laser absorbing layer and the pulse pitch and the index pitch of the laser light radiation, which enables the separation of the first substrate and the second substrate.

11. The substrate manufacturing method of claim 10, wherein the pulse pitch and the index pitch of the laser light radiation is set such that a laser processing time of the combined substrate is minimized.

12. The substrate manufacturing method of claim 10, wherein the pulse pitch and the index pitch of the laser light radiation is set such that a laser processing time of the combined substrate becomes a required laser processing time.

* * * * *